United States Patent
Jung et al.

(10) Patent No.: US 7,456,709 B2
(45) Date of Patent: Nov. 25, 2008

(54) BULK ACOUSTIC RESONATOR INCLUDING A RESONANCE PART WITH DIMPLE AND FABRICATION METHOD THEREFOR

(75) Inventors: Kyu-dong Jung, Suwon-si (KR);
Jong-oh Kwon, Suwon-si (KR);
Woon-bae Kim, Suwon-si (KR);
In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 11/397,704

(22) Filed: Apr. 5, 2006

(65) Prior Publication Data
US 2007/0008050 A1    Jan. 11, 2007

(30) Foreign Application Priority Data
Jul. 5, 2005    (KR) .................. 10-2005-0060454

(51) Int. Cl.
*H03H 9/15* (2006.01)
*H03H 9/54* (2006.01)

(52) U.S. Cl. .............. 333/187; 333/189; 310/324; 310/349; 310/367

(58) Field of Classification Search ............. 333/187, 333/189; 310/324, 349, 367
See application file for complete search history.

(56) References Cited

U.S. PATENT DOCUMENTS

| | | | |
|---|---|---|---|
| 6,262,637 B1 * | 7/2001 | Bradley et al. | 333/133 |
| 7,046,103 B2 * | 5/2006 | Whatmore et al. | 333/204 |
| 7,187,254 B2 * | 3/2007 | Su et al. | 333/189 |
| 7,212,082 B2 * | 5/2007 | Nagao et al. | 333/187 |
| 7,227,433 B2 * | 6/2007 | Ginsburg et al. | 333/187 |
| 7,271,684 B2 * | 9/2007 | Nishihara et al. | 333/133 |

FOREIGN PATENT DOCUMENTS

WO    WO 2005/060091    *    6/2005

* cited by examiner

*Primary Examiner*—Barbara Summons
(74) *Attorney, Agent, or Firm*—Sughrue Mion, PLLC

(57) ABSTRACT

A bulk acoustic resonance and a method for fabricating the bulk acoustic resonator, the bulk acoustic resonator including: a substrate including an upper surface defining a predetermined area including a cavity; a resonance part positioned above the cavity and including a surface comprising a dimple; and an anchor part connecting the resonance part to the substrate. The resonance part includes: a lower electrode including a lower surface including a predetermined dimpled area and an upper surface opposite to the predetermined dimpled area; a piezoelectric layer stacked on the upper surface of the lower electrode; and an upper electrode stacked on the piezoelectric layer. Because direction of the vibration of the resonator is adjustable by adjusting position, area, and the number of the dimples, process freedom can be improved.

5 Claims, 3 Drawing Sheets

BULK ACOUSTIC RESONATOR INCLUDING A RESONANCE PART WITH DIMPLE AND FABRICATION METHOD THEREFOR

CROSS-REFERENCE TO RELATED APPLICATIONS

This application claims the benefit of Korean Patent Application No. 2005-60454, filed Jul. 5, 2005, in the Korean Intellectual Property Office, the disclosure of which is incorporated herein by reference.

BACKGROUND OF THE INVENTION

1. Field of the Invention

The present invention relates to a method for fabricating a bulk acoustic resonator, and more particularly, to a bulk acoustic resonator fabricated with a dimple in a surface of a resonance part positioned above a cavity formed in a substrate so as to adjust a direction toward which the resonance part vibrates, and a method for fabricating the bulk acoustic resonator.

2. Description of the Related Art

With the rapid popularization of mobile communication devices, representative of which are portable phones, demands for more compact and lighter filters for use in the mobile communication devices have been sharply increased. Bulk acoustic resonators are known to be compact and light filters. Bulk acoustic resonators can be mass-produced in a small form factor at a minimum cost. Also, the bulk acoustic resonators can realize high quality factor (Q) values that are major characteristics of filters and be used in a microwave frequency band, particularly, in personal communication system (PCS) and digital cordless system (DCS) bands.

In general, a bulk acoustic resonator's resonance part is made by sequentially stacking a first electrode, a piezoelectric layer, and a second electrode on a substrate. If electric energy is applied to the first and second electrodes to maintain an electric field in the piezoelectric layer, the electric field causes a piezoelectric phenomenon in the piezoelectric layer so as to vibrate the resonance part. Thus, a bulk acoustic wave is generated in the same direction as the direction along which the resonance part vibrates so as to produce a resonance.

Examples of such a bulk acoustic resonator include a Bragg reflector type resonator and an air gap type resonator. In the Bragg reflector type resonator, stepped materials having a great elastic impedance difference are deposited on a substrate to constitute a reflector layer, and a lower electrode, a piezoelectric layer, and an upper electrode are sequentially stacked on the reflector layer. Thus, elastic wave energy having passed through the piezoelectric layer is not transmitted toward the substrate but reflected by the reflector layer so as to produce an efficient resonance. However, it is difficult to fabricate the reflector layer for totally reflecting the elastic wave energy in the Bragg reflector type resonator. Thus, a large amount of time and cost are required in fabricating the Bragg reflector type resonator.

To solve the disadvantages of the Bragg reflector resonator, an air gap resonator uses an air gap instead of a reflector layer so as to isolate the resonance part from the substrate. Thus, the resonator has a high reflection characteristic and a stable practical band.

FIG. 1 is cross-sectional view of a general air gap type resonator. Referring to FIG. 1, the general air gap type resonator includes a resonance part 60 positioned on a substrate 10. A cavity 50 is formed in a surface of the substrate 10 so as to isolate the resonance part 60 from the substrate 10. The resonance part 60 includes a structure in which a lower electrode 20, a piezoelectric layer 30, and an upper electrode 40 are sequentially stacked.

In the general air gap type resonator shown in FIG. 1, the resonance part 60 is fabricated in a flat board form in a space above the cavity 50. In general, the resonance part 60 fabricated in the space above the cavity 50 is circular or polygonal as viewed in a horizontal direction of the air gap type resonator. If a position of a power source connected to the lower and upper electrodes 20 and 40 is changed in this case, a direction along which an electric field is formed between the lower and upper electrodes 20 and 40 varies. A vibration direction of the resonance part 60 varies with the variation in the direction along which the electric field is formed. In other words, the electric field may pass through the center or edge of the resonance part 60.

An area in which the electric field is directly formed above the resonance 60 experiences a great vibration due to a great intensity of the electric field, while the other areas have relatively small vibration. Thus, the vibration direction varies depending on where the electric field is formed.

The resonance part 60 may vibrate perpendicular to the surface of the substrate 10. However, in the general air gap type resonator, the resonance part 60 is fabricated in flat board form. Thus, the position of the power source connected to the lower and upper electrodes 20 and 40 can be adjusted so that the resonance part 60 vibrates perpendicular to the surface of the substrate 10. As a result, it is difficult to design an optimal resonator.

SUMMARY OF THE INVENTION

Accordingly, the present general inventive concept has been made to solve the above-mentioned problems, and an aspect of the present general inventive concept is to provide a bulk acoustic resonator fabricated with at least one or more dimples in a surface of a resonance part positioned above a cavity to improve process freedom and so as to vibrate the resonance part perpendicular to the surface of the substrate, and a method for fabricating the bulk acoustic resonator.

According to an aspect of the present invention, there is provided a bulk acoustic resonator including: a substrate including an upper surface including a predetermined area comprising a cavity; a resonance part positioned above the cavity and comprising a surface including a dimple; and an anchor part connecting the resonance part to the substrate.

The resonance part may include: a lower electrode including a lower surface including a predetermined dimpled area and an upper surface opposite to the predetermined dimpled area; a piezoelectric layer stacked on the upper surface of the lower electrode; and an upper electrode stacked on the piezoelectric layer. If a power source having a predetermined intensity is connected to the upper and lower electrodes, the resonance part may vibrate based on the anchor part.

The anchor part may have a structure in which the lower electrode, the piezoelectric layer, and the upper electrode are sequentially stacked.

The anchor part may further include an insulating layer positioned between the lower surface of the lower electrode and the upper surface of the substrate.

The resonance part may include a plurality of dimples. The plurality of dimples may have different areas.

According to another aspect of the present invention, there is provided a method for fabricating a bulk acoustic resonator, including: stacking a sacrificial layer in a predetermined area of a substrate; stacking a lower electrode on the sacrificial layer and the substrate; stacking a piezoelectric layer on the lower electrode; stacking an upper electrode on the piezoelectric layer; etching a portion of the lower electrode and a lower portion of the substrate comprising the sacrificial layer to form a cavity; and etching the sacrificial layer.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE EXEMPLARY EMBODIMENTS

Figure 1:
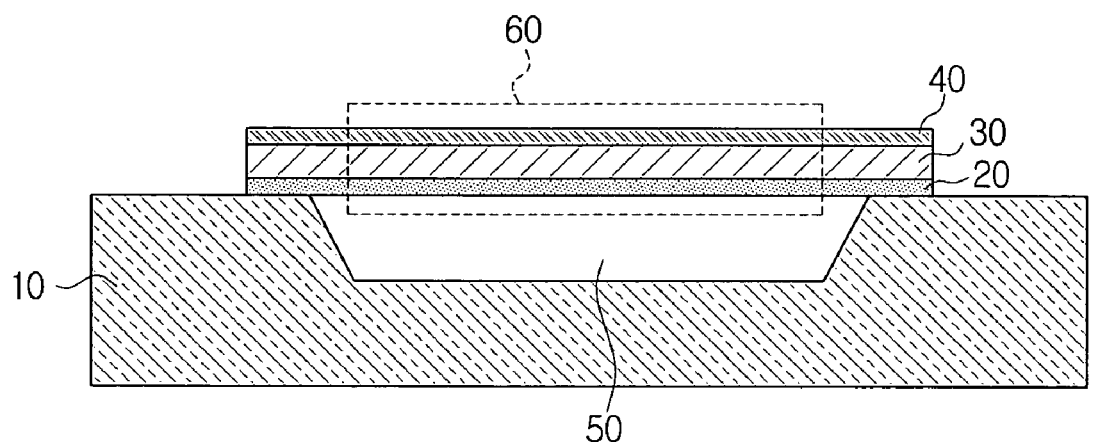
FIG. 1 is a cross-sectional view of a general bulk acoustic resonator.

Certain embodiments of the present invention will be described in greater detail with reference to the accompanying drawings.

In the following description, same drawing reference numerals are used for the same elements throughout the drawings. The embodiments defined in the description and their detailed construction and elements are provided to assist in a comprehensive understanding of the invention. Thus, it is apparent that the present invention can be carried out without these defined elements. Well-known functions or constructions are not described in detail since they would obscure the invention in unnecessary detail.

Figure 2:
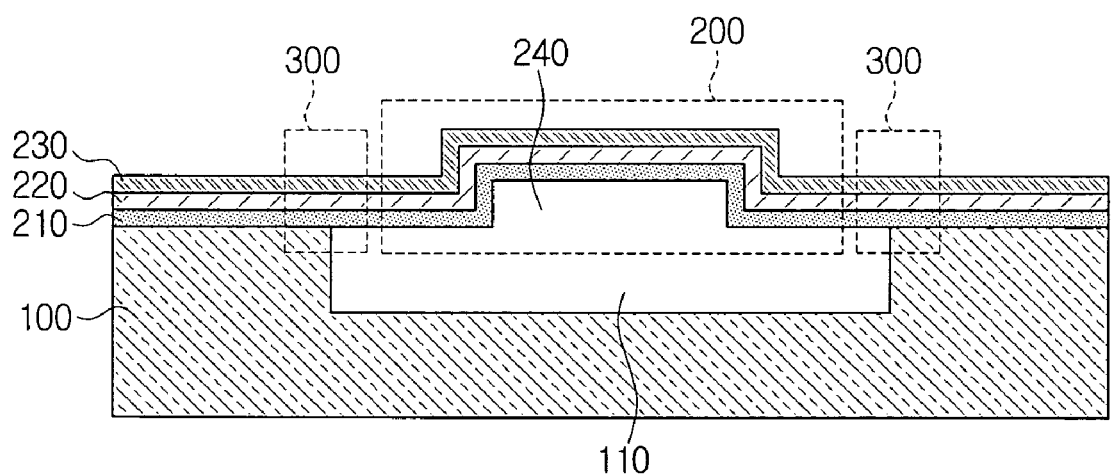
FIG. 2 is a cross-sectional view of a bulk acoustic resonator according to an embodiment of the present invention.

FIG. 2 is a cross-sectional view of a bulk acoustic resonator according to an embodiment of the present invention. Referring to FIG. 2, the bulk acoustic resonator includes a substrate 100, a resonance part 200, and an anchor part 300.

A cavity 110 is formed in an upper surface of the substrate 100. The resonance part 200 is positioned in a space above the cavity 110.

The resonance part 200 includes a lower electrode 210, a piezoelectric layer 220, and an upper electrode 230. The lower and upper electrodes 210 and 230 may be formed of general metals. If an external power source is connected to the lower and upper electrodes 210 and 230 to apply an alternating signal to the lower and upper electrodes 210 and 230, the piezoelectric layer 220 undergoes a piezoelectric phenomenon. Thus, the resonance part 200 vibrates based on the anchor part 300.

The anchor part 300 connects the resonance part 200 to the substrate 100 and supports the resonance part 200 so that the resonance part 200 remains suspended above the cavity 110. The anchor part 300 may include the lower electrode 210, a piezoelectric layer 220, and the upper electrode 230 like the resonance part 200.

A dimple 240 is fabricated in a surface of the resonance part 200. In other words, an area is dimpled in a lower surface of the lower electrode 210 constituting the resonance part 200, and an upper surface of the lower electrode 210 opposite to the dimpled area protrudes. Upper surfaces of the piezoelectric layer 220 and the upper electrode 230 stacked on the lower electrode 210 protrude in the same area in which the upper surface of the lower electrode 210 protrudes. As a result, the area dimpled in the lower surface of the lower electrode 210 corresponds to the dimple 240.

The resonance part 200 may be thus formed as a 3-dimensional form rather than the flat board form. The position, area, depth, and number of the dimples 240 may be arbitrarily set by a manufacturer of the bulk acoustic resonator. In other words, if the resonance part 200 does not vibrate perpendicular to the surface of the substrate 100, the manufacturer of the bulk acoustic resonator may design the bulk acoustic resonator so to form the dimple 240 in a part of the resonance part 200 having a great vibration range to adjust a direction toward which the resonance part 200 vibrates.

Figure 3A:
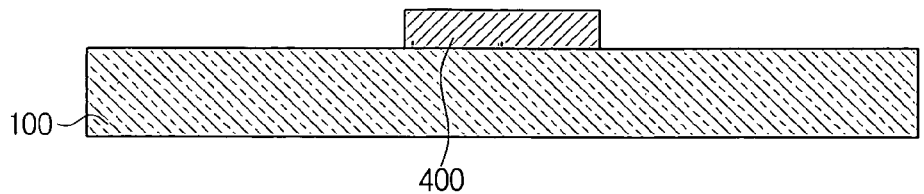
FIGS. 3A through 3D are cross-sectional views illustrating a method for fabricating the bulk acoustic resonator shown in FIG. 2.

FIGS. 3A through 3D are cross-sectional views illustrating a method for fabricating the bulk acoustic resonator shown in FIG. 2. Referring to FIG. 3A, a sacrificial layer 400 is stacked in a predetermined pattern on a substrate 100. The sacrificial layer 400 will be etched later to fabricate the dimple 240 and thus is generally formed of a material that is easily etched. The sacrificial layer 400 may be formed of MgO or ZnO.

Figure 3B:
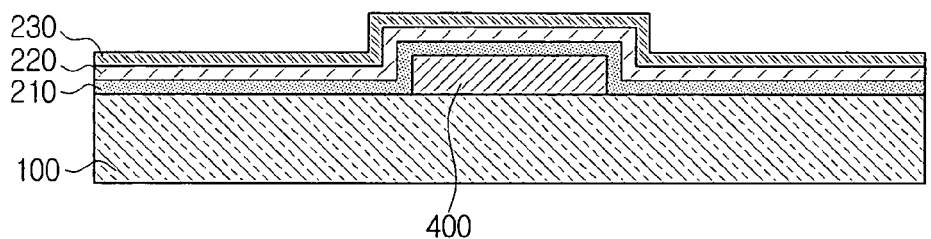

Referring to FIG. 3B, the lower electrode 210, the piezoelectric layer 220, and the upper electrode 230 are sequentially stacked on an entire surface of the substrate 100 on which the sacrificial layer 400 has been stacked. The lower and upper electrodes 210 and 230 may be formed of Al, W, Au, Pt, Ni, Ti, Cr, Pd, Mo, or the like. The piezoelectric layer 220 may be formed of AlN or ZnO.

Figure 3C:
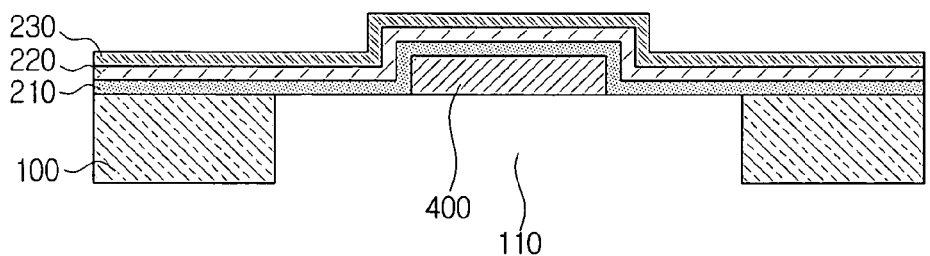

As shown in FIG. 3C, a lower portion of the substrate 100 is etched to form the cavity 110. In this case, a viahole (not shown) connected from a lower surface of the substrate 100 to an area to be etched may be formed, and then an etchant or a gas may be injected through the viahole to etch the lower portion of the substrate 100. An area of the lower surface of the substrate 100 corresponding to the cavity 110 may be etched as shown in FIG. 3C. In this case, a lower surface of the sacrificial layer 400 may be exposed to air, and thus the sacrificial layer 400 may be easily etched in a subsequent process.

Figure 3D:
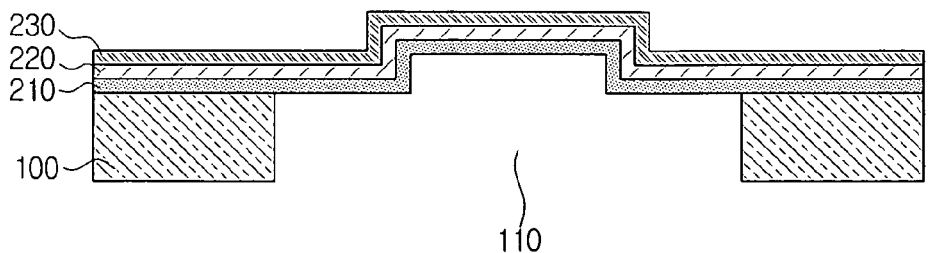

Referring to FIG. 3D, the etchant or the gas is injected through the etched area of the substrate 100 into the sacrificial layer 400 to etch the sacrificial layer 400. Thus, the dimple 240 is formed.

Although not shown in FIG. 3D, after the dimple 240 is completed, a predetermined substrate may be bonded to the lower surface of the substrate 100 to prevent foreign elements from flowing into the cavity 110.

Figure 4:
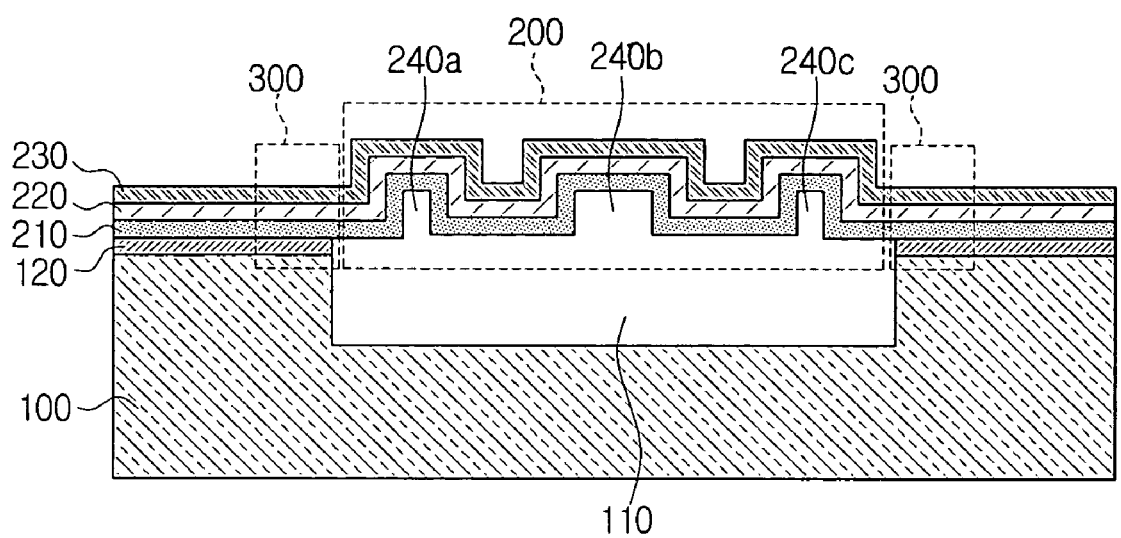
FIG. 4 is a cross-sectional view of a bulk acoustic resonator according to another embodiment of the present invention.

FIG. 4 is a cross-sectional view of a bulk acoustic resonator according to another embodiment of the present invention. Referring to FIG. 4, a resonance part 200 of the bulk acoustic resonator includes first, second, and third dimples 240a, 240b, and 240c.

Only the first, second, and third dimples 240a, 240b, and 240c are shown in FIG. 4. However, the number of dimples may be set by the manufacturer. Areas of the dimples may also be set by the manufacturer. As shown in FIG. 4, areas of the first and third dimples 240a and 240c are the same, and an area of the second dimple 240b is different from the areas of the first and third dimples 240a and 240c.

An insulating layer 120 may be additionally formed on the substrate 100. The insulating layer 120 electrically insulates the resonance part 200 from the substrate 100.

An anchor part 300 is formed on the insulating layer 120 to support the resonance part 200 so that the resonance part 200 vibrates. The anchor part 300 and the resonance part 200 may commonly include a lower electrode 210, a piezoelectric layer 220, and an upper electrode 230 as described above.

Thus, the anchor part 300 and the resonance part 200 may be fabricated using the same process.

As described above, according to the present invention, a dimple can be fabricated on a surface of a resonance part so as to easily adjust a direction toward which the resonance part vibrates. Thus, the processing freedom can be increased. Therefore, the resonance part can be easily adjusted so as to vibrate perpendicular to a surface of the substrate. As a result, a bulk acoustic resonator operating in an optimal resonance mode can be realized.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A bulk acoustic resonator comprising:
    a substrate comprising an upper surface defining a predetermined area comprising a cavity;
    a resonance part positioned above the cavity and comprising a surface comprising a dimple; and
    an anchor part connecting the resonance part to the substrate;
    wherein the resonance part comprises at least two dimples disposed above the cavity.

2. The bulk acoustic resonator of claim 1, wherein the resonance part comprises:
    a lower electrode comprising a lower surface comprising a predetermined dimpled area and an upper surface opposite to the predetermined dimpled area;
    a piezoelectric layer stacked on the upper surface of the lower electrode; and
    an upper electrode stacked on the piezoelectric layer,
    wherein if a power source having a predetermined intensity is connected to the upper and lower electrodes, the resonance part vibrates while the anchor part is in a fixed state.

3. The bulk acoustic resonator of claim 1, wherein the anchor part has a structure in which the lower electrode, the piezoelectric layer, and the upper electrode are sequentially stacked.

4. The bulk acoustic resonator of claim 3, wherein the anchor part further comprises an insulating layer positioned between the lower surface of the lower electrode and the upper surface of the substrate.

5. The bulk acoustic resonator of claim 1, wherein the at least two dimples have different areas.

* * * * *